(12) United States Patent
Kwon et al.

(10) Patent No.: US 11,581,388 B2
(45) Date of Patent: Feb. 14, 2023

(54) DISPLAY APPARATUS

(71) Applicant: Samsung Display Co., Ltd., Yongin-Si (KR)

(72) Inventors: Sora Kwon, Yongin-si (KR); Mijin Yoon, Yongin-si (KR); Oukjae Lee, Yongin-si (KR)

(73) Assignee: Samsung Display Co., Ltd.

( * ) Notice: Subject to any disclaimer, the term of this patent is extended or adjusted under 35 U.S.C. 154(b) by 296 days.

(21) Appl. No.: 17/074,520

(22) Filed: Oct. 19, 2020

(65) Prior Publication Data

US 2021/0305349 A1    Sep. 30, 2021

(30) Foreign Application Priority Data

Mar. 26, 2020    (KR) .................. 10-2020-0037056

(51) Int. Cl.
  *H01L 27/32*    (2006.01)

(52) U.S. Cl.
  CPC ........ *H01L 27/3276* (2013.01); *H01L 27/326* (2013.01)

(58) Field of Classification Search
  CPC ..................... H01L 27/326; H01L 27/3276
  See application file for complete search history.

(56) References Cited

U.S. PATENT DOCUMENTS

| 10,756,136 | B1 * | 8/2020 | Ma ................... H01L 31/147 |
| 11,456,440 | B2 * | 9/2022 | Sung | |
| 2019/0115415 | A1 | 4/2019 | Choi et al. | |
| 2019/0348443 | A1 | 11/2019 | Kimura | |
| 2020/0410921 | A1 * | 12/2020 | Kim ................... G09G 3/3233 |
| 2021/0202657 | A1 * | 7/2021 | Cho .................... G09G 3/3233 |
| 2021/0216157 | A1 * | 7/2021 | Jeong ................. G06F 3/0446 |

FOREIGN PATENT DOCUMENTS

| JP | 2005-046352 A | 2/2005 |
| KR | 10-1296697 B1 | 8/2013 |
| KR | 10-2018-0049296 A | 5/2018 |
| KR | 10-2019-0041553 A | 4/2019 |
| KR | 10-2019-0119960 A | 10/2019 |

* cited by examiner

*Primary Examiner* — Douglas M Menz
(74) *Attorney, Agent, or Firm* — Innovation Counsel LLP

(57) ABSTRACT

A display apparatus includes a substrate, a first pixel, a voltage line set, and a connection conductive layer. The substrate includes a transmission area, a display area, and a first non-display area. The display area surrounds the transmission area. The first non-display area is positioned between the transmission area and the display area. No image-displaying pixels are positioned on the transmission area or the first non-display area. The first pixel is arranged on the display area and includes a display element and a pixel circuit. The voltage line set is electrically connected to the pixel circuit and overlaps both the display area and the first non-display area. The connection conductive layer is positioned on the first non-display area, surrounds the transmission area, and is electrically connected to the voltage line set. A material of the voltage line is identical to a material of the connection conductive layer.

20 Claims, 15 Drawing Sheets

DISPLAY APPARATUS

CROSS-REFERENCE TO RELATED APPLICATION

This application claims priority to and the benefit of Korean Patent Application No. 10-2020-0037056, filed on Mar. 26, 2020, in the Korean Intellectual Property Office; the Korean Patent Application is incorporated by reference.

BACKGROUND

1. Field

The technical field relates to a display apparatus.

2. Description of Related Art

A display apparatus may include a display area for displaying images according to input signals. Additional functions may be implemented near the display area. For example, a sensing function may be implemented in an area that is surrounded by the display area.

SUMMARY

Embodiments may be related a display apparatus with a minimum unwanted resistance deviation between wires.

Embodiments may be related to a display apparatus with minimum stain potentially caused by a brightness difference of light emitted from display elements of pixels.

According to one or more embodiments, a display apparatus includes a substrate including a transmission area, a display area, and a first non-display area, the display area surrounding the transmission area, and the first non-display area being between the transmission area and the display area, a pixel arranged in the display area and including a display element and a pixel circuit, a voltage line connected to the pixel circuit and extending from the display area to the first non-display area, and a connection conductive layer in the first non-display area, surrounding the transmission area and connected to the voltage line, wherein the voltage line includes the same material as that of the connection conductive layer.

The voltage line and the connection conductive layer may be arranged on different layers.

The display apparatus may further include an inorganic insulating layer arranged between the substrate and the display element, wherein the voltage line may be connected to the connection conductive layer through a contact portion of the inorganic insulating layer.

The inorganic insulating layer may include a first inorganic insulating layer, a second inorganic insulating layer, and a third inorganic insulating layer, and the voltage line may be arranged between the first inorganic insulating layer and the second inorganic insulating layer.

The connection conductive layer may be arranged between the second inorganic insulating layer and the third inorganic insulating layer.

The display apparatus may further include an organic insulating layer arranged between the inorganic insulating layer and the display element, wherein the connection conductive layer may be arranged between the inorganic insulating layer and the organic insulating layer.

The display apparatus may further include an inorganic insulating layer and an organic insulating layer each arranged between the substrate and the display element, wherein the connection conductive layer may be arranged on the organic insulating layer, and the voltage line may be connected to the connection conductive layer through a contact portion of the inorganic insulating layer and the organic insulating layer.

The display apparatus may further include a connection electrode arranged between the inorganic insulating layer and the organic insulating layer, wherein the voltage line may be connected to the connection conductive layer through the connection electrode.

The voltage line and the connection conductive layer may be arranged on the same layer and provided as one body.

The pixel may include a first pixel and a second pixel that neighbor each other, the voltage line may include a first voltage line and a second voltage line, the first voltage line being connected to the first pixel, and the second voltage line being connected to the second pixel, and the connection conductive layer may be connected to both the first voltage line and the second voltage line.

The voltage line may include a first initialization voltage line that overlaps the transmission area in a first direction or a second direction that intersects the first direction.

The display apparatus may further include a second initialization voltage line extending in the first direction and apart from the transmission area in the second direction.

The voltage line may include a horizontal voltage line extending in a first direction and connected to the connection conductive layer, and a vertical voltage line extending from the connection conductive layer in a second direction intersecting the first direction.

The horizontal voltage line may include a first horizontal voltage line and a second horizontal voltage line that are arranged symmetrically to each other with respect to the transmission area.

According to one or more embodiments, a display apparatus includes a substrate including a transmission area, a display area, and a first non-display area, the display area surrounding the transmission area, and the first non-display area being between the transmission area and the display area, a first pixel and a second pixel neighboring each other in the display area and each including a display element and a pixel circuit, a first voltage line and a second voltage line, the first voltage line being connected to the first pixel, and the second voltage line being connected to the second pixel, and a connection conductive layer arranged in the first non-display area and connected to both the first voltage line and the second voltage line, wherein the first voltage line, the second voltage line, and the connection conductive layer include the same material.

The first voltage line and the connection conductive layer may be arranged on different layers.

The display apparatus may further include insulating layers arranged between the substrate and the display element, wherein the first voltage line may be connected to the connection conductive layer through a first contact portion of the insulating layers.

The first voltage line, the second voltage line, and the connection conductive layer may be provided as one body.

The connection conductive layer may surround the transmission area.

Each of the first voltage line and the second voltage line may include an initialization voltage line.

An embodiment may be related to a display apparatus. The display apparatus may include a substrate, a first pixel, a voltage line set, and a connection conductive layer. The substrate may include a transmission area, a display area, and a first non-display area. The display area surrounds the transmission area. The first non-display area may be positioned between the transmission area and the display area. No image-displaying pixels may be positioned on the transmission area or the first non-display area. The first pixel may be arranged on the display area and may include a display element and a pixel circuit. The voltage line set may be electrically connected to the pixel circuit and overlaps both the display area and the first non-display area. The connection conductive layer may be positioned on the first non-display area, surrounds the transmission area, and may be electrically connected to the voltage line set. A material of the voltage line may be identical to a material of the connection conductive layer.

The display apparatus may include an insulating material layer directly contacting the voltage line set and spaced from the connection conductive layer.

The display apparatus may include an inorganic insulating layer arranged between the substrate and the display element. The voltage line set may be electrically connected to the connection conductive layer through a contact hole of the inorganic insulating layer.

The inorganic insulating layer may include a first inorganic insulating layer, a second inorganic insulating layer, and a third inorganic insulating layer. The first inorganic insulating layer may be the insulating material layer. The voltage line set may be arranged between the first inorganic insulating layer and the second inorganic insulating layer.

The connection conductive layer may be arranged between the second inorganic insulating layer and the third inorganic insulating layer.

The display apparatus may include an organic insulating layer arranged between the inorganic insulating layer and the display element. The connection conductive layer may be arranged between the inorganic insulating layer and the organic insulating layer.

The display apparatus may include an inorganic insulating layer and an organic insulating layer each arranged between the substrate and the display element. The connection conductive layer may be arranged on the organic insulating layer. The voltage line set may be electrically connected to the connection conductive layer through a contact hole of the inorganic insulating layer and the organic insulating layer.

The display apparatus may include a connection electrode at least partially arranged between the inorganic insulating layer and the organic insulating layer. The voltage line set may be electrically connected to the connection conductive layer through the connection electrode.

The display apparatus may include an insulating material directly contacting each of a face of the voltage line set and a face of the connection conductive layer. The face of the voltage line set and the face of the connection conductive layer may be directed connected to each other and may be both formed of the material of the voltage line set.

The display apparatus may include a second pixel neighboring the first pixel. The voltage line set may include a first voltage line and a second voltage line. The connection conductive layer may be electrically connected through the first voltage line to the first pixel and may be electrically connected through the second voltage line to the second pixel.

The voltage line set may include a first initialization voltage line positioned between two portions of the transmission area in a first direction or a second direction different from the first direction.

The display apparatus may include a second initialization voltage line extending in the first direction and spaced from the transmission area in the second direction.

The voltage line set may include the following members: a first horizontal voltage line being lengthwise in a first direction and directly connected to the connection conductive layer; and a vertical voltage line directly connected to the connection conductive layer and being lengthwise in a second direction different from the first direction.

The voltage line set may include a second horizontal voltage line that may be a mirror image to the first horizontal voltage line with respect to the transmission area.

An embodiment may be related to a display apparatus. The display apparatus may include the following elements: a substrate including a transmission area, a display area, and a first non-display area, the display area surrounding the transmission area, the first non-display area being positioned between the transmission area and the display area, no image-displaying pixels being positioned on the transmission area or the first non-display area; a first pixel and a second pixel neighboring each other, positioned on the display area, and each including a display element and a pixel circuit; a first voltage line; a second voltage line; and a connection conductive layer arranged on the first non-display area, electrically connected through the first voltage line to the first pixel, and electrically connected through the second voltage line to the second pixel. A material of the first voltage line, a material of the second voltage line, and a material of the connection conductive layer may be identical to each other.

The display apparatus may include an insulating material layer directly contacting the first voltage line and spaced from the connection conductive layer.

The display apparatus may include insulating layers arranged between the substrate and the display element of the first pixel. The first voltage line may be connected to the connection conductive layer through a first contact hole of the insulating layers.

The first voltage line, the second voltage line, and the connection conductive layer may be directly connected to each other.

The connection conductive layer may surround the transmission area.

The display apparatus may include a terminal electrically connected to each of the first voltage line and the second voltage line and configured to receive an initialization voltage.

DETAILED DESCRIPTION

Figure 1:
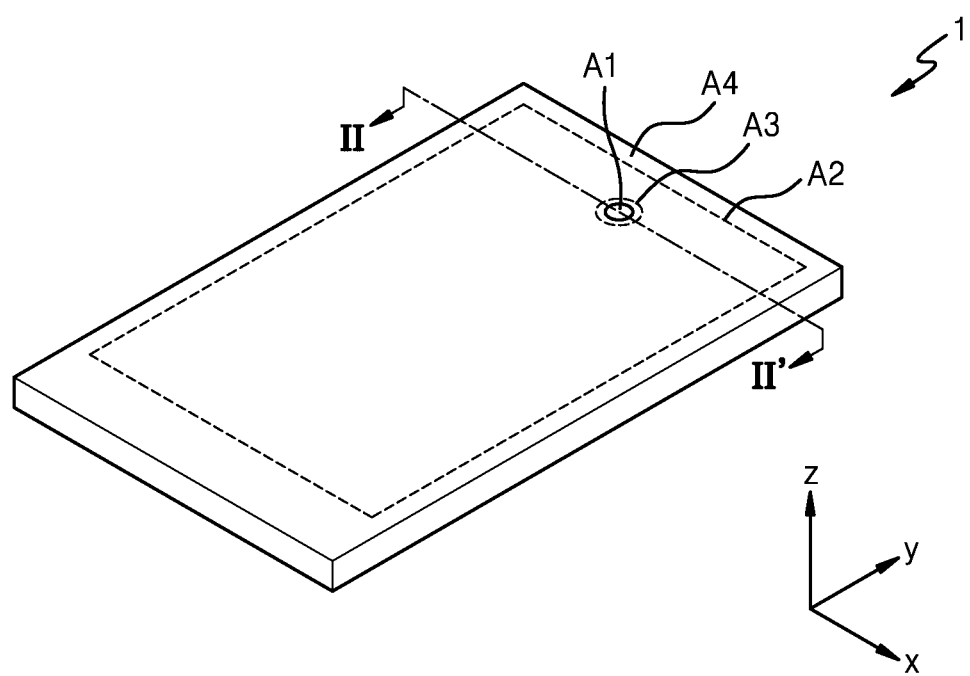
FIG. 1 is a perspective view of a display apparatus according to an embodiment.

Example embodiments are described with reference to the accompanying drawings, wherein like reference numerals may refer to like elements.

Although the terms "first," "second," etc. may be used to describe various elements, these elements should not be limited by these terms. These terms may be used to distinguish one element from another element. A first element may be termed a second element without departing from teachings of one or more embodiments. The description of an element as a "first" element may not require or imply the presence of a second element or other elements. The terms "first," "second," etc. may be used to differentiate different categories or sets of elements. For conciseness, the terms "first," "second," etc. may represent "first-type (or first-set)," "second-type (or second-set)," etc., respectively.

The singular forms "a," "an," and "the" may indicate the plural forms as well, unless the context clearly indicates otherwise.

Sizes of elements in the drawings may be exaggerated or reduced for convenience of explanation.

When a certain embodiment may be implemented differently, a specific process order may be performed differently from the described order. For example, two consecutively described processes may be performed substantially at the same time or performed in an order opposite to the described order.

The term "connect" may mean "electrically connect" or "electrically connected through no intervening transistor." The term "insulate" may mean "electrically insulate" or "electrically isolate." The term "conductive" may mean "electrically conductive." The term "drive" may mean "operate" or "control." The term "portion" may mean "member," "element," or "component." The term "line" may mean "line set" or "wiring." The expression that an element includes a material may mean that the element is formed of the material or includes a layer formed of the material. A listing of materials may mean at least one of the listed materials.

FIG. 1 is a perspective view of a display apparatus 1 according to an embodiment.

Referring to FIG. 1, the display apparatus 1 may include a first area A1 and a second area A2 surrounding the first area A1. A plurality of pixels, for example, an array of pixels may be arranged in the second area A2. The second area A2 may display an image through the array of pixels. The second area A2 may be (a substantial portion of) a display area for displaying an image according to input signals. The first area A1 may be entirely surrounded by the second area A2. The first area A1 may accommodate a component for performing one or more functions. For example, the component may be/include a sensor and/or a camera that may use light, and the first area A1 may be/include a transmission area that transmits light emitted by the sensor and/or transmits light toward the camera.

A third area A3 may be arranged between the first area A1 and the second area A2. The third area A3 may be/include a first non-display area in which no pixels are arranged. Wires detouring around (or bypassing) the first area A1 may be arranged in the third area A3. A fourth area A4 surrounding the second area A2 may be/include a second non-display area in which no pixels are arranged. Various kinds of wires and built-in circuits may be arranged in the fourth area A4.

Each pixel of the display apparatus 1 may include a light-emitting diode as a display element that may emit light having a predetermined color. The light-emitting diode may include an organic light-emitting diode including an organic material as an emission layer. The light-emitting diode may include an inorganic light-emitting diode. The light-emitting diode may include quantum dots as the emission layer.

Though it is shown in FIG. 1 that the first area A1 is arranged at the center of the second area A2 in a width direction (e.g. a ±x direction) of the display apparatus 1, the first area A1 may be arranged offset on left or right in the width direction of the display apparatus 1. The first area A1 may be arranged on various positions such as the top side, the center, or the bottom side in the lengthwise direction (e.g. a ±y direction) of the display apparatus 1.

Though it is shown in FIG. 1 that the display apparatus 1 includes one first area A1, the display apparatus 1 may include a plurality of first areas A1.

Figure 2:
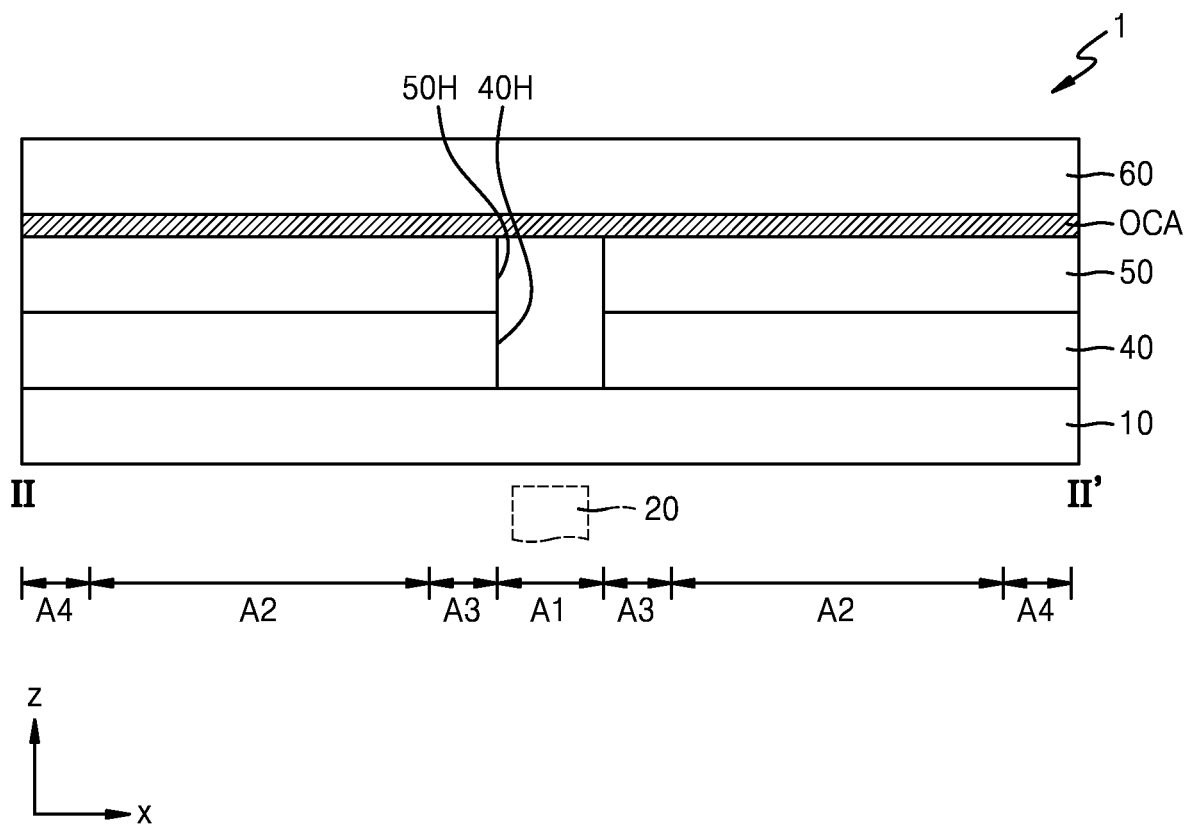
FIG. 2 is a cross-sectional view of a display apparatus according to an embodiment.

FIG. 2 is a cross-sectional view of the display apparatus 1 according to an embodiment taken along line II-II' of FIG. 1.

Referring to FIG. 2, the display apparatus 1 may include a display panel 10, an input sensing portion 40, and an optical functional portion 50, the input sensing portion 40 and the optical functional portion 50 being arranged on the display panel 10. These elements may be covered by a window 60. The window 60 may be coupled to the optical functional portion 50 through an adhesive layer such as an optical clear adhesive (OCA). The display apparatus 1 may be applicable to various electronic apparatuses such as mobile phones, tablet personal computers (PC), notebook computers, and smartwatches.

The display panel 10 may include a plurality of diodes arranged in the second area A2. The input sensing portion 40 may obtain coordinate information corresponding to an external input, for example, a touch event. The input sensing portion 40 may include a sensing electrode and trace lines connected to the sensing electrode. The input sensing portion 40 may be arranged on the display panel 10. The input sensing portion 40 may sense an external input using a mutual capacitive method or a self-capacitive method.

The input sensing portion 40 may be directly formed on the display panel 10 with no intervening adhesive. The input sensing portion 40 may be separately formed and then coupled to the display panel 10 using an adhesive layer such as the OCA.

The optical functional portion 50 may include a reflection prevention layer. The reflection prevention layer may reduce reflectivity/reflection of light (external light) that has been incident toward the display panel 10 through the window 60. The reflection prevention layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

The reflection prevention layer may include a black matrix and color filters. The color filters may be arranged according the arrangement of the pixels of the display panel 10. The reflection prevention layer may include a destructive interference structure. The destructive interference structure may include a first reflection layer and a second reflection layer. First-reflected light and second-reflected light respectively reflected by the first reflection layer and the second reflection layer may create destructive-interference and thus the reflectivity/reflection of external light may be reduced.

The optical functional portion 50 may include a lens layer. The lens layer may improve emission efficiency of light emitted from the display panel 10 or reduce color deviation. The lens layer may include a layer having concave and/or convex lenses and/or may include a plurality of layers having different refractive indexes. The optical functional portion 50 may include the reflection prevention layer and/or the lens layer.

Each of the input sensing portion 40 and the optical functional portion 50 may include a hole. For example, the input sensing portion 40 may include a hole 40H connecting a top surface and a bottom surface of the input sensing portion 40. The optical functional portion 50 may include a hole 50H connecting a top surface and a bottom surface of the optical functional portion 50. The hole 40H of the input sensing portion 40 and the hole 50H of the optical functional layer 50 may be arranged in the first area A1 and may correspond to each other.

When the adhesive layer between the window 60 and the optical functional layer 50 includes an OCA, the adhesive layer may not include a hole corresponding to the first area A1.

A component 20 may be arranged in the first area A1. The component 20 may include an electronic element. For example, the component 20 may be/include an electronic element that uses light or sound. The electronic element may be/include at least one of a sensor such as an infrared sensor that emits and/or receives light, a camera that receives light to capture an image, a sensor that outputs and senses light or sound to measure a distance or recognize a fingerprint, a small lamp that outputs light, and a speaker that outputs sound. When the component 20 includes an electronic element that uses light or sound, the electronic element may use light in at least one of various wavelength bands such as visible light, infrared light, and ultraviolet light. In an embodiment, the first area A1 may include a transmission area (of the display panel 10) that transmits light output from the component 20 and/or transmits light toward the component 20.

When the display apparatus 1 is used in a smartwatch or an instrument panel for an automobile, the component 20 may be a member such as clock hands or a needle indicating predetermined information (e.g. the velocity of a vehicle, etc.). When the display apparatus 1 includes clock hands or an instrument panel for an automobile, the component 20 may protrude beyond the window 60, and the window 60 may include an opening corresponding to the first area A1.

The component 20 may add a predetermined function and/or an aesthetic sense to the display apparatus 1.

Figure 3:
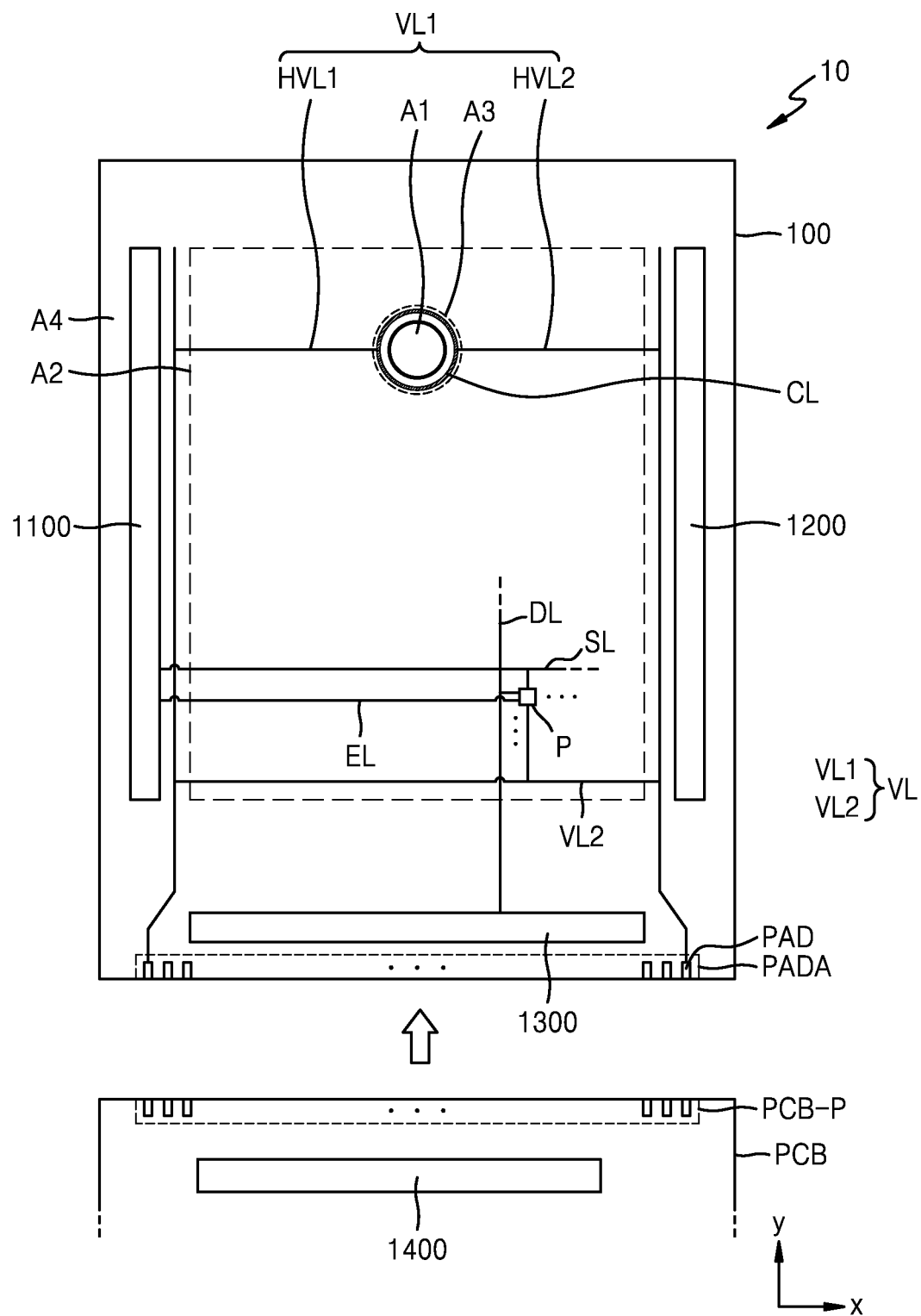
FIG. 3 is a plan view of a display panel according to an embodiment.

FIG. 3 is a plan view of the display panel 10 according to an embodiment. Each of FIGS. 4A and 4B is an equivalent circuit diagram of a pixel P of the display panel 10 according to an embodiment.

Referring to FIG. 3, the display panel 10 may include the first area A1, the second area A2, the third area A3, and the fourth area A4, the second area A2 surrounding the first area A1, the third area A3 being between the first area A1 and the second area A2, and the fourth area A4 surrounding the second area A2. A substrate 100 of the display panel 10 may correspondingly include a first area A1, a second area A2, a third area A3, and a fourth area A4. The display panel 10 may be electrically connected to a circuit board terminal portion PCB-P of a printed circuit board PCB.

The display panel 10 may include a plurality of pixels P arranged in the second area A2. As shown in FIGS. 4A and 4B, each pixel P may include a pixel circuit PC and a display element (for example, an organic light-emitting diode OLED) connected to the pixel circuit PC.

Figure 4A:
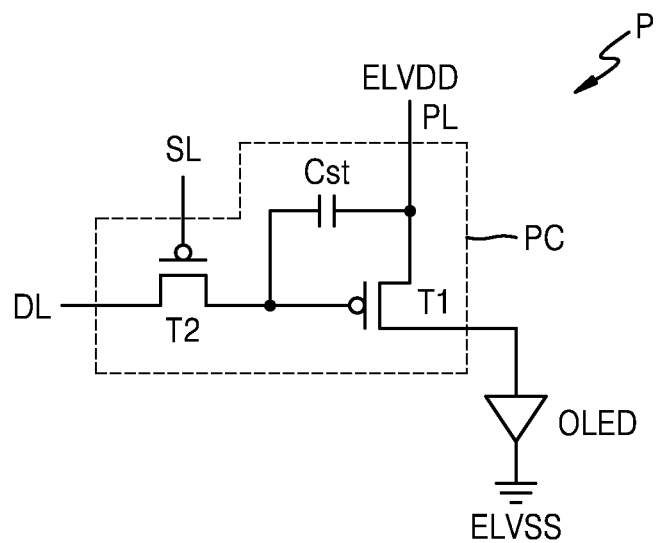
FIG. 4A is an equivalent circuit diagram of a pixel of a display panel according to an embodiment.
Figure 4B:
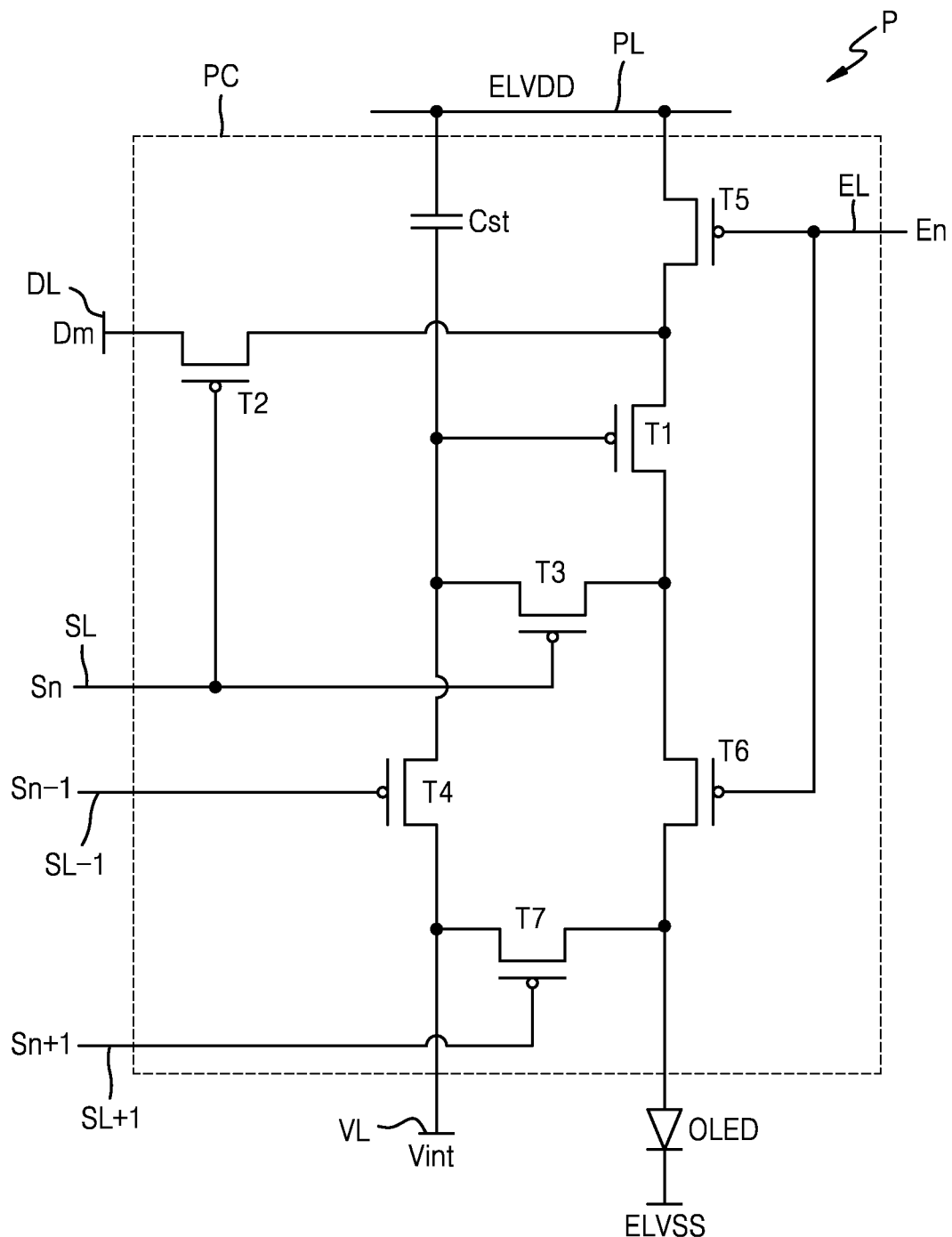
FIG. 4B is an equivalent circuit diagram of a pixel of a display panel according to an embodiment.

Referring to FIG. 4A, the pixel circuit PC may include a driving thin film transistor T1, a switching thin film transistor T2, and a storage capacitor Cst. Each pixel P may emit, for example, red, green, or blue light, or emit red, green, blue, or white light through the organic light-emitting diode OLED.

The switching thin film transistor T2 may be connected to a scan line SL and a data line DL and may transfer a data signal or a data voltage input from the data line DL to the driving thin film transistor T1 based on a scan signal or a switching voltage input from the scan line SL. The storage capacitor Cst may be connected to the switching thin film transistor T2 and a driving voltage line PL and stores a voltage corresponding to a difference between a voltage transferred from the switching thin film transistor T2 and a first power voltage ELVDD supplied to the driving voltage line PL.

The driving thin film transistor T1 may be connected between the driving voltage line PL and the storage capacitor Cst and may control a driving current flowing through the organic light-emitting diode OLED from the driving voltage line PL in response to the voltage stored in the storage capacitor Cst. The organic light-emitting diode OLED may emit light having a predetermined brightness by using the driving current. An opposite electrode (e.g. a cathode) of the organic light-emitting diode OLED may receive a second power voltage ELVSS.

Referring to FIG. 4B, the pixel circuit PC may include the driving thin film transistor T1, the switching thin film transistor T2, a compensation thin film transistor T3, a first initialization thin film transistor T4, an operation control thin film transistor T5, an emission control thin film transistor T6, and a second initialization thin film transistor T7.

At least one of the signal lines SL, SL−1, SL+1, EL, and DL, and/or the initialization voltage line VL may be shared by neighboring pixels.

A drain electrode of the driving thin film transistor T1 may be electrically connected to the organic light-emitting diode OLED through the emission control thin film transistor T6. The driving thin film transistor T1 receives a data signal Dm and supplies the driving current to the organic light-emitting diode OLED in response to a switching operation of the switching thin film transistor T2.

A gate electrode of the switching thin film transistor T2 is connected to the scan line SL, and a source electrode of the switching thin film transistor T2 is connected to the data line DL. A drain electrode of the switching thin film transistor T2 is connected to a source electrode of the driving thin film transistor T1 and simultaneously connected to the driving voltage line PL through the operation control thin film transistor T5.

The switching thin film transistor T2 is turned on in response to a scan signal Sn transferred through the scan line SL and performs a switching operation of transferring a data signal Dm transferred through the data line DL to the source electrode of the driving thin film transistor T1.

A gate electrode of the compensation thin film transistor T3 may be connected to the scan line SL. A source electrode of the compensation thin film transistor T3 may be connected to the drain electrode of the driving thin film transistor T1 and simultaneously connected to a pixel electrode of the organic light-emitting diode OLED through the emission control thin film transistor T6. A drain electrode of the compensation thin film transistor T3 may be simultaneously connected to one of electrodes of the storage capacitor Cst, a source electrode of the first initialization thin film transistor T4, and the gate electrode of the driving thin film transistor T1. The compensation thin film transistor T3 may be turned on in response to a scan signal Sn transferred through the scan line SL and diode-connect the driving thin film transistor T1 by connecting the gate electrode of the driving thin film transistor T1 to the drain electrode of the driving thin film transistor T1.

A gate electrode of the first initialization thin film transistor T4 may be connected to a previous scan line SL−1. A drain electrode of the first initialization thin film transistor T4 may be connected to the initialization voltage line VL. A source electrode of the first initialization thin film transistor T4 may be simultaneously connected to one of the electrodes of the storage capacitor Cst, the drain electrode of the compensation thin film transistor T3, and the gate electrode of the driving thin film transistor T1. The first initialization thin film transistor T4 is turned on in response to a previous scan signal Sn−1 transferred through the previous scan line SL−1 and performs an initialization operation of initializing a voltage of the gate electrode of the driving thin film transistor T1 by transferring an initialization voltage Vint to the driving gate electrode of the driving thin film transistor T1.

A gate electrode of the operation control thin film transistor T5 may be connected to the emission control line EL. A source electrode of the operation control thin film transistor T5 may be connected to the driving voltage line PL. A drain electrode of the operation control thin film transistor T5 may be connected to the source electrode of the driving thin film transistor T1 and the drain electrode of the switching thin film transistor T2.

A gate electrode of the emission control thin film transistor T6 may be connected to the emission control line EL. A source electrode of the emission control thin film transistor T6 may be connected to the drain electrode of the driving thin film transistor T1 and the source electrode of the compensation thin film transistor T3. A drain electrode of the emission control thin film transistor T6 may be electrically connected to the pixel electrode of the organic light-emitting diode OLED. The operation control thin film transistor T5 and the emission control thin film transistor T6 are simultaneously turned on in response to an emission control signal En transferred through the emission control line EL, the first power voltage ELVDD is transferred to the organic light-emitting diode OLED, and the driving current flows through the organic light-emitting diode OLED.

A gate electrode of the second initialization thin film transistor T7 may be connected to a next scan line SL+1. A source electrode of the second initialization thin film transistor T7 may be connected to the pixel electrode of the organic light-emitting diode OLED. A drain electrode of the second initialization thin film transistor T7 may be connected to the initialization voltage line VL. The second initialization thin film transistor T7 may be turned on in response to a next scan signal Sn+1 transferred through the next scan line SL+1 to initialize the pixel electrode of the organic light-emitting diode OLED.

FIG. 4B shows the case where the first initialization thin film transistor T4 and the second initialization thin film transistor T7 are respectively connected to the previous scan line SL−1 and the next scan line SL+1. Both the first initialization thin film transistor T4 and the second initialization thin film transistor T7 may be connected to the previous scan line SL−1 and driven in response to a previous scan signal Sn−1.

The other electrode of the storage capacitor Cst may be connected to the driving voltage line PL. One electrode of the storage capacitor Cst may be simultaneously connected to the gate electrode of the driving thin film transistor T1, the drain electrode of the compensation thin film transistor T3, and the source electrode of the first initialization thin film transistor T4.

The opposite electrode (e.g. a cathode) of the organic light-emitting diode OLED receives the second power voltage ELVSS. The organic light-emitting diode OLED emits light by receiving the driving current from the driving thin film transistor T1.

The pixel circuit PC is not limited to the number of thin film transistors, the number of storage capacitors, and the circuit design described with reference to FIGS. 4A and 4B. The number of thin film transistors, the number of storage capacitors, and the circuit design may be configured according to embodiments.

Referring to FIG. 3 again, the third region A3 may surround the first area A1. The third area A3 may include no light-emitting display element. A signal line or a voltage line may pass across the third area A3 for providing a signal to pixels P arranged in the first area A1. A connection conductive line CL may be arranged in the third area A3, the connection conductive line CL surrounding the first area A1.

A first driver 1100, a second driver 1200, a data driver 1300, and a pad area PADA may be arranged in the fourth area A4. The first driver 1100 and the second driver 1200 may provide scan signals and/or emission control signals to the pixels P. The data driver 1300 may provide data signals to the pixels P. A plurality of pads PAD may be arranged in the pad area PADA. The pads PAD may be electrically connected to terminals of the circuit board terminal portion PCB-P.

The second area may be positioned between the first driver 1100 and the second driver 1200. The first driver 1100 or the second driver 1200 may be connected to the scan lines SL and/or the emission control lines EL connected to the pixels P.

A scan line SL may provide a scan signal to a pixel P. The scan line SL may extend in a first direction (e.g. an x direction) from the first driver 1100 or the second driver 1200.

An emission control line EL may provide an emission control signal to a pixel P. The emission control line EL may extend in the first direction (e.g. the x direction) from the first driver 1100 or the second driver 1200.

The data driver 1300 may neighbor one side of the substrate 100. The data driver 1300 may be arranged on the printed circuit board PCB.

A data line DL may provide a data signal to a pixel P. The data line DL may extend in a second direction (e.g. a y direction) from the data driver 1300.

A power supply portion 1400 may be arranged on the printed circuit board PCB. The power supply portion 1400 may provide the first power voltage ELVDD (see FIG. 4B), the second power voltage ELVSS (see FIG. 4B), and the initialization voltage Vint (see FIG. 4B). The power supply portion 1400 may be arranged in the fourth area A4.

The initialization voltage line VL may be connected to the pad PAD. Sections of the initialization voltage line VL may extend in the second direction (e.g. the y direction) in the fourth area A4. Sections of the initialization voltage line VL may extend in the lengthwise direction of the first driver 1100 and/or the second driver 1200.

The initialization voltage line VL may transfer the initialization voltage from the power supply portion 1400 to each pixel P. The initialization voltage line VL may include a first initialization voltage line VL1 and a second initialization voltage line VL2, the first initialization voltage line VL1 overlapping (being aligned with, and/or being positioned between two portions of) the first area A1 in the first direction (e.g. the x direction) or the second direction (e.g. the y direction), the second initialization voltage line VL2 being spaced from the first area A1 in the second direction (e.g. the y direction).

The first initialization voltage line VL1 may include a first horizontal voltage line HVL1 and a second horizontal voltage line HVL2 each extending in the first direction (e.g. the x direction). The first horizontal voltage line HVL1 and the second horizontal voltage line HVL2 may correspond to the first area A1. The first horizontal voltage line HVL1 and the second horizontal voltage line HVL2 may be symmetrically arranged at opposite sides of the first area A1. The first horizontal voltage line HVL1 and the second horizontal voltage line HVL2 may extend from the fourth area A4 to the third area A3 in the first direction (e.g. the x direction). Each of the first horizontal voltage line HVL1 and the second horizontal voltage line HVL2 may be connected to the connection conductive line CL. Though not shown, the first initialization voltage line VL1 may include a vertical voltage line extending in the second direction (e.g. the y direction).

Figure 5:
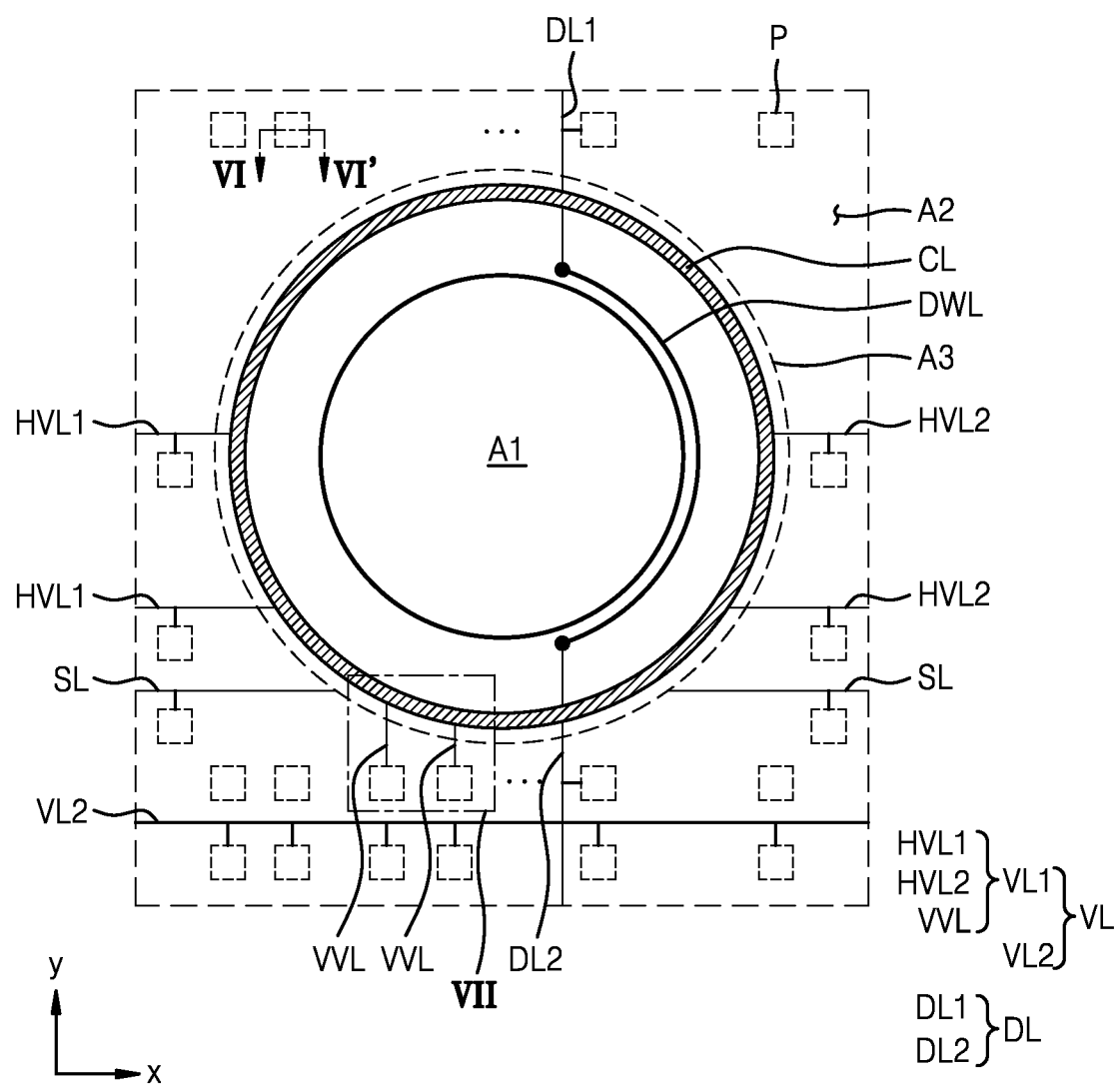
FIG. 5 is a plan view of a portion of a display panel according to an embodiment.

FIG. 5 is a plan view of a portion of a display panel according to an embodiment.

Referring to FIG. 5, the substrate may include the first area A1, the second area A2, and the third area A3, the second area A2 surrounding the first area A1, and the third area A3 being between the first area A1 and the second area A2. A pixel P may be arranged in the second area A2 and may include a display element and a pixel circuit. The initialization voltage line VL may include the first initialization voltage line VL1 and the second initialization voltage line VL2.

Some of the pixels P arranged in the second area A2 may be separated from each other by the first area A1. The first area A1 may be arranged between two pixels P aligned in the first direction (e.g. the x direction). The first area A1 may be arranged between two pixels P aligned in the second direction (e.g. the y direction).

The pixels P may be connected to the scan lines SL, first and second data lines DL1 and DL2, and the initialization voltage line VL. The scan lines SL may extend in the first direction (e.g. the x direction). The first and second data lines DL1 and DL2 may extend in the second direction (e.g. the y direction). The initialization voltage line VL may include sections extending in the first direction (e.g. the x direction) and the second direction (e.g. the y direction).

The first initialization voltage line VL1 may overlap (and/or may be aligned with) the first area A1 in the first direction (e.g. the x direction) and/or the second direction (e.g. the y direction). The first initialization voltage line VL1 may include the first horizontal voltage line HVL1, the second horizontal voltage line HVL2, and a vertical voltage line VVL. The first horizontal voltage line HVL1 and the second horizontal voltage line HVL2 may be respectively connected to two pixels P arranged at opposite sides of the first area A1 and aligned in the first direction (e.g. the x direction). The vertical voltage line VVL may extend in the second direction (e.g. the y direction) and may be connected to the pixels P neighboring the first area A1.

The second initialization voltage line VL2 may be spaced from the first area A1 in the second direction (e.g. the y direction). The second initialization voltage line VL2 may be lengthwise in the first direction (e.g. the x direction).

The connection conductive layer CL may be arranged in the third area A3. The connection conductive layer CL may surround the first area A1. The connection conductive layer CL may completely surround the first area A1.

The connection conductive layer CL may be connected to the first initialization voltage line VL1. That is, the connection conductive layer CL may be connected to each of the first horizontal voltage line HVL1, the second horizontal voltage line HVL2, and the vertical voltage line VVL. The connection conductive layer CL may include and/or may be formed of the same conductive material as the first initialization voltage line VL1. Each of the connection conductive layer CL and the first initialization voltage line VL1 may include at least one of molybdenum (Mo), aluminum (Al), copper (Cu), and titanium (Ti) and may include a single layer or multi-layer structure.

Therefore, the resistance of the combination of the connection conductive layer CL and the first initialization voltage line VL1 may not be significantly deviate from the resistance of the second initialization voltage line VL2. Therefore, the brightness of a pixel connected to the first initialization voltage line VL1 may not be significantly different from the brightness of a pixel connected to the second initialization voltage line VL2. Advantageously, unwanted stain in a displayed image may be prevented.

A data line DL may include a first data line DL1, a second data line DL2 spaced from the first data line DL1 by the first area A1, and a detouring wiring line DWL connecting the first data line DL1 to the second data line DL2. The detouring wiring line DWL may be arranged on a layer different from the first data line DL1 or the second data line DL2 and may be connected to the first data line DL1 or the second data line DL2 through a contact hole. The detouring wiring line DWL may be arranged in the third area A3 and may detour along the edge of the first area A1.

The first data line DL1, the second data line DL2, and the detouring wiring line DWL may be arranged on the same layer. The first data line DL1, the second data line DL2, and the detouring wiring line DWL may be provided as one body.

The detouring wiring line DWL may be arranged inside the connection conductive layer CL. The connection conductive layer CL may surround the detouring wiring line DWL. The detouring wiring line DWL may be closer to the first area A1 than the connection conductive layer CL, and the connection conductive layer CL may be closer to the second area A2 than the detouring wiring line DWL.

Two pixels P aligned in the first direction (e.g. the x direction) and separated by the first area A1 may be respectively electrically connected to different scan lines SL. The scan lines SL on the left of the first area A1 may be electrically connected to the first driver 1100 (shown in FIG. 3), and the scan lines SL on the right of the first area A1 may be electrically connected to the second driver 1200 (shown in FIG. 3). Pixels P on two opposite sides of the first area A1 may be electrically connected to scan lines SL spaced from each other. Some of the scan lines SL may be separated from each other by the first area A1.

The second driver 1200 (see FIG. 3) may be optional, and two pixels P aligned in the first direction (e.g. the x direction) and separated by the first area A1 may be connected to the same scan line. The scan line may include a detouring portion in the third area A3.

Figure 6:
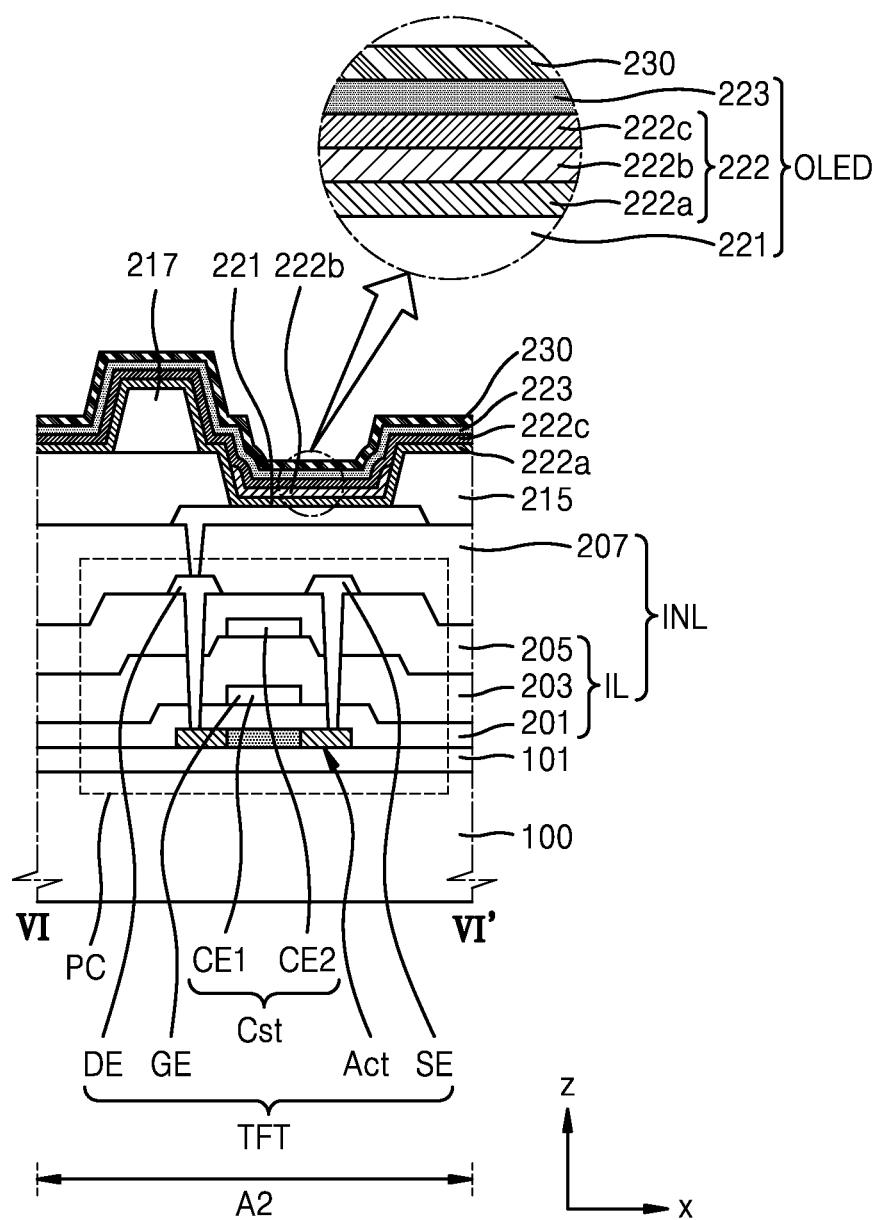
FIG. 6 is a cross-sectional view of one of pixels according to an embodiment.

FIG. 6 is a cross-sectional view of a pixel taken along line VI-VI' of FIG. 5 according to an embodiment.

Referring to FIG. 6, the pixel circuit PC may be arranged over the substrate 100, and the organic light-emitting diode OLED may be arranged on and electrically connected to the pixel circuit PC. The substrate 100 may include glass or a polymer resin. The substrate 100 may include a single layer or multi-layer structure.

A buffer layer 101 may be arranged on the substrate 100 to block foreign substances, moisture, or external air potentially penetrating the substrate 100 and to provide a flat surface on the substrate 100. The buffer layer 101 may include an inorganic material such as an oxide or a nitride, an organic material, or an inorganic/organic composite material and may include a single layer or a multi-layer structure including an inorganic material and/or an organic material. A barrier layer (not shown) may be further arranged between the substrate 100 and the buffer layer 101 for blocking air.

The pixel circuit PC may be arranged on the buffer layer 101. Insulating layers INL may be arranged on the buffer layer 101. The insulating layers INL may include an inorganic insulating layer IL and an organic insulating layer 207. The inorganic insulating layer IL may include a first inorganic insulating layer 201, a second inorganic insulating layer 203, and a third inorganic insulating layer 205.

The pixel circuit PC may include a thin film transistor TFT and a storage capacitor Cst. The thin film transistor TFT may include a semiconductor layer Act, a gate electrode GE, a source electrode SE, and a drain electrode DE. The pixel circuit PC may include a top-gate type thin film transistor TFT in which the gate electrode GE is arranged farther from the substrate 100 than the semiconductor layer Act. The thin film transistor TFT may be a bottom-gate type thin film transistor.

The semiconductor layer Act may include polycrystalline silicon. The semiconductor layer Act may include amorphous silicon, an oxide semiconductor, or an organic semiconductor. The gate electrode GE may include a low-resistance metal material. The gate electrode GE may include a conductive material including at least one of molybdenum (Mo), aluminum (Al), copper (Cu), and titanium (Ti) and include a single layer or multi-layer structure.

The first inorganic insulating layer 201 between the semiconductor layer Act and the gate electrode GE may include an inorganic insulating material such as silicon oxide, silicon nitride, silicon oxynitride, aluminum oxide, titanium oxide, tantalum oxide, and hafnium oxide. The first inorganic insulating layer 201 may include a single layer or a multi-layer structure.

The source electrode SE and the drain electrode DE may include a material having excellent conductivity. The source electrode SE and the drain electrode DE may include a conductive material including molybdenum (Mo), aluminum (Al), copper (Cu), and titanium (Ti) and may include a single layer or a multi-layer structure. The source electrode SE and the drain electrode DE may include a multi-layer of Ti, Al, and Ti.

The storage capacitor Cst may include a bottom electrode CE1 and a top electrode CE2 overlapping each other and separated by the second inorganic insulting layer 203. The storage capacitor Cst may overlap the thin film transistor TFT. The gate electrode GE of the thin film transistor TFT may serves as the bottom electrode CE1 of the storage capacitor Cst. The storage capacitor Cst may not overlap the thin film transistor TFT. The storage capacitor Cst may be covered by the third inorganic insulating layer 205.

The second inorganic insulating layer 203 and the third inorganic insulating layer 205 each may include an inorganic insulating material such as at least one of silicon oxide, silicon nitride, silicon oxynitride, aluminum oxide, titanium oxide, tantalum oxide, and hafnium oxide. The second inorganic insulating layer 203 and the third inorganic insulating layer 205 each may include a single layer or a multi-layer structure.

The pixel circuit PC (including the thin film transistor TFT and the storage capacitor Cst) may be covered by the organic insulating layer 207. The organic insulating layer 207 may include a substantially flat top surface. The organic insulating layer 207 may include an organic insulating material including a general-purpose polymer such as polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, or a blend of some of the above materials. The organic insulating layer 207 may include polyimide.

A pixel electrode 221 may be arranged on the organic insulating layer 207. The pixel electrode 221 may include a conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The pixel electrode 221 may include a reflective layer including at least one of silver (Ag), magnesium (Mg), aluminum (Al), platinum (Pt), palladium (Pd), gold (Au), nickel (Ni), neodymium (Nd), iridium (Ir), and chrome (Cr). The pixel electrode 221 may include a layer including ITO, IZO, ZnO, or $In_2O_3$ on/under the reflective layer.

A pixel-defining layer 215 may be formed on the pixel electrode 221. The pixel-defining layer 215 includes an opening that exposes a top surface of the pixel electrode 221 and may cover edges of the pixel electrode 221. The pixel-defining layer 215 may include an organic insulating material. The pixel-defining layer 215 may include an inorganic insulating material such as silicon oxide, silicon oxynitride, and silicon nitride. The pixel-defining layer 215 may include an organic insulating material and an inorganic insulating material.

An intermediate layer 222 may include an emission layer 222*b*. The emission layer 222*b* may include, for example, an organic material. The emission layer 222*b* may include a polymer organic material or a low molecular weight organic material emitting light having a predetermined color. The intermediate layer 222 may include a first functional layer 222*a* and/or a second functional layer 222*c*, the first functional layer 222a being under the emission layer 222b, and the second functional layer 222c being on the emission layer 222b.

The first functional layer 222a may include a single layer or a multi-layer structure. When the first functional layer 222a includes a polymer material, the first functional layer 222a may include a hole transport layer (HTL), which has a single-layered structure, and include poly(3,4-ethylenedioxythiophene) (PEDOT) or polyaniline (PANI). When the first functional layer 222a includes a low molecular weight material, the first functional layer 222a may include a hole injection layer (HIL) and a hole transport layer (HTL).

The second functional layer 222c may be optional. When the first functional layer 222a and the emission layer 222b include a polymer material, the second functional layer 222c may be formed. The second functional layer 222c may include a single layer or a multi-layer. The second functional layer 222c may include an electron transport layer (ETL) and/or an electron injection layer (EIL).

An emission layer 222b of an intermediate layer 222 may be arranged for each pixel in the second area A2. The emission layer 222b may overlap the opening of the pixel-defining layer 215 and/or the pixel electrode 221. The first and second functional layers 222a and 222c of the intermediate layer 222 are provided as a single body and may be formed in not only the second area A2 but also the third area A3 described with reference to FIG. 5.

An opposite electrode 223 may include a conductive material having a low work function. For example, the opposite electrode 223 may include a semi-transparent or transparent layer including silver (Ag), magnesium (Mg), aluminum (Al), platinum (Pt), palladium (Pd), gold (Au), nickel (Ni), neodymium (Nd), iridium (Ir), chrome (Cr), lithium (Li), calcium (Ca), or an alloy of some of the metals. The opposite electrode 223 may further include a layer including ITO, IZO, ZnO, or $In_2O_3$. The opposite electrode 223 is provided as a single body to cover a plurality of pixel electrodes 211 in the second area A2. The intermediate layer 222 and the opposite electrode 223 may be formed by thermal deposition.

A spacer 217 may be arranged on the pixel-defining layer 215. The spacer 217 may include an organic insulating material such as polyimide. The spacer 217 may include an inorganic insulating material such as silicon nitride or silicon oxide or include an organic insulating material and an inorganic insulating material.

The spacer 217 may include a material different from the/a material of the pixel-defining layer 215. The spacer 217 may include the same material as the pixel-defining layer 215. The pixel-defining layer 215 and the spacer 217 may be simultaneously formed during a mask process that uses a half-tone mask, etc. The pixel-defining layer 215 and the spacer 217 may include polyimide.

A capping layer 230 may be arranged on the opposite electrode 223. The capping layer 230 may include lithium fluoride (LiF), an inorganic material, and/or an organic material. The capping layer 230 may be optional.

A thin-film encapsulation layer may be arranged on the capping layer 230. The thin-film encapsulation layer may include at least one inorganic encapsulation layer and at least one organic encapsulation layer.

The at least one inorganic encapsulation layer may include at least one of aluminum oxide, titanium oxide, tantalum oxide, hafnium oxide, zinc oxide, silicon oxide, silicon nitride, and silicon oxynitride. The at least one organic encapsulation layer may include a polymer-based material. A polymer-based material may include an acryl-based resin, an epoxy-based resin, polyimide, and/or polyethylene. The organic encapsulation layer may include acrylate.

The substrate 100 may be coupled to a top substrate, which is a transparent member, by a sealing member such that an inner space between the substrate 100 and the top substrate is sealed. A moisture-absorber or a filling material, etc. may be arranged in the inner space. The sealing member may include sealant. The sealing member may include a material hardened by a laser. For example, the sealing member may include frit. The sealing member may include a urethane-based resin, an epoxy-based resin, and an acrylic resin, which are organic sealants, or silicon, which is an inorganic sealant. The urethane-based resin may include, for example, urethane acrylate. The acrylate-based resin may include, for example, butyl acrylate and ethylhexyl acrylate. The sealing member may include a material hardened by heat.

Figure 7:
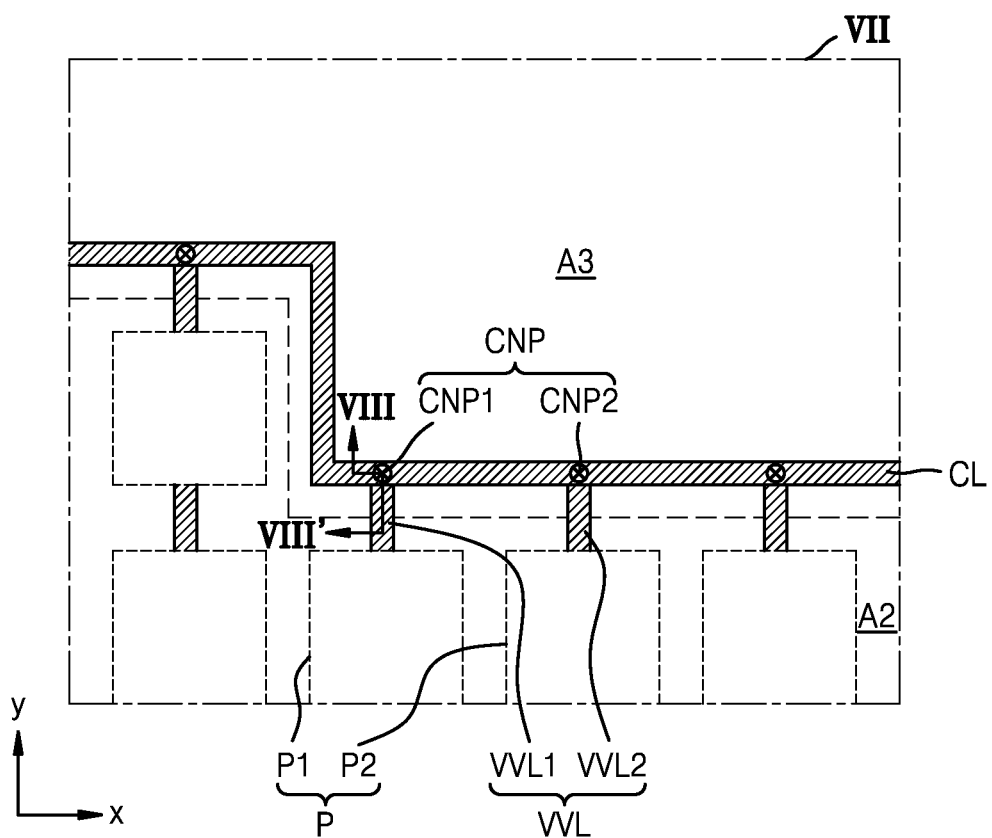
FIG. 7 is a plan view of region VII of FIG. 5 according to an embodiment.

FIG. 7 is a plan view of a region VII of FIG. 5 according to an embodiment.

Referring to FIG. 7, the substrate may include the second area A2 and the third area A3, the second area A2 surrounding the first area A1, and the third area A3 being arranged between the first area A1 and the second area A2.

A plurality of pixels P may be arranged in the second area A2, the pixels P each including a pixel circuit and a display element. The plurality of pixels P may be arranged in the first direction (e.g. the x direction) and/or the second direction (e.g. the y direction). Some of the pixels P may neighbor each other and neighbor the third area A3. For example, the first pixel P1 and the second pixel P2 may be aligned in the first direction (e.g. the x direction) and may neighbor the third area A3.

Some of the pixels P may be connected to voltage lines extending from the second area A2 to the third area A3 and including the vertical voltage line VVL, which is a section of the initialization voltage line VL. The vertical voltage line VVL may extend in the second direction (e.g. the y direction) from the connection conductive layer CL. The first pixel P1 may be connected to a first voltage line VVL1 extending in the second direction (e.g. the y direction), and the second pixel P2 may be connected to a second voltage line VVL2 extending in the second direction (e.g. the y direction). The vertical voltage line VVL may include a conductive material including molybdenum (Mo), aluminum (Al), copper (Cu), and/or titanium (Ti) and may include a single layer or a multi-layer structure.

The connection conductive layer CL may be arranged in the third area A3. The connection conductive layer CL may neighbor the second area A2. The connection conductive layer CL may be bent along pixels P arranged in the second area A2. The conductive layer CL may include a conductive material including molybdenum (Mo), aluminum (Al), copper (Cu), and/or titanium (Ti) and include a single layer or a multi-layer structure. The connection conductive layer CL and the vertical voltage line VVL may include the same material. For example, When the vertical voltage line VVL includes molybdenum (Mo), the connection conductive layer CL also may include molybdenum (Mo). Therefore, stain potentially caused by a brightness difference of light emitted from pixels P may be prevented.

The connection conductive layer CL and the voltage line may be arranged directly on different layers. For example, the connection conductive layer CL and the vertical voltage line VVL may be arranged directly on different layers. The horizontal voltage line HVL described in FIG. 5 may be arranged directly on a layer different from the connection conductive layer CL. The connection conductive layer CL may be connected to the voltage line through a contact portion CNP of an insulating layer. For example, the first voltage line VVL1 may be connected to the connection conductive layer CL through a first contact portion CNP1. The second voltage line VVL2 may be connected to the connection conductive layer CL through a second contact portion CNP2.

Figure 8:
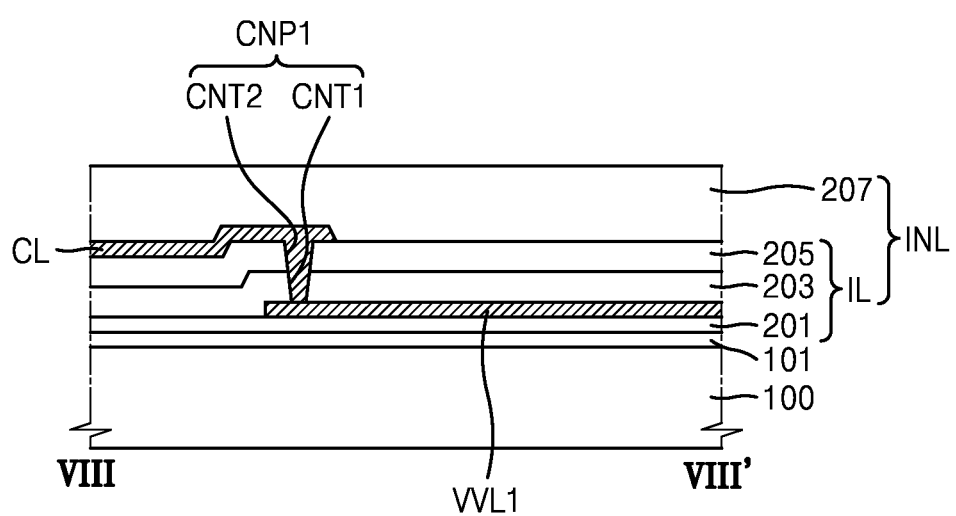
FIG. 8 is a cross-sectional view taken along line VIII-VIII' of FIG. 7 according to an embodiment.

FIG. 8 is a cross-sectional view of the display panel taken along line VIII-VIII' of FIG. 7 according to an embodiment.

Referring to FIG. 8, the display panel may include the buffer layer 101 and the insulating layers INL on the substrate 100. The insulating layers INL may include the inorganic insulating layer IL and the organic insulating layer 207. The inorganic insulating layer IL may include the first inorganic insulating layer 201, the second inorganic insulating layer 203, and the third inorganic insulating layer 205.

The first voltage line VVL1 may be arranged between the first inorganic insulating layer 201 and the second inorganic insulating layer 203. The connection conductive layer CL may be arranged between the third inorganic insulating layer 205 and the organic insulating layer 207.

The first voltage line VVL1 may be connected to the connection conductive layer CL through the first contact portion CNP1. The first contact portion CNP1 may include a first contact hole CNT1 and a second contact hole CNT2. The first contact hole CNT1 may be provided in the second inorganic insulating layer 203, and the second contact hole CNT2 may be provided in the third inorganic insulating layer 205. The first contact hole CNT1 may overlap and be directly connected to the second contact hole CNT2.

Figure 9:
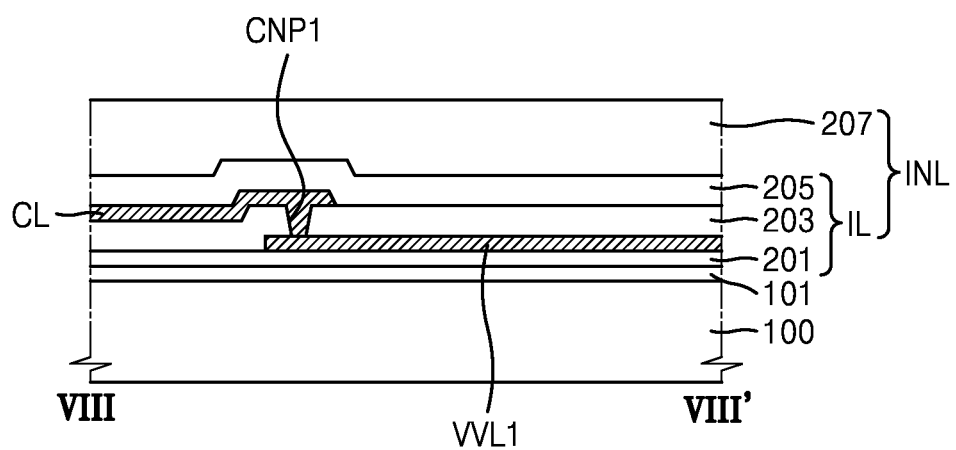
FIG. 9 is a cross-sectional view taken along line VIII-VIII' of FIG. 7 according to an embodiment.

FIG. 9 is a cross-sectional view of the display panel taken along line VIII-VIII' of FIG. 7 according to an embodiment.

Referring to FIG. 9, the display panel may include the buffer layer 101 and the insulating layers INL on the substrate 100. The insulating layers INL may include the inorganic insulating layer IL and the organic insulating layer 207. The inorganic insulating layer IL may include the first inorganic insulating layer 201, the second inorganic insulating layer 203, and the third inorganic insulating layer 205.

The first voltage line VVL1 may be arranged between the first inorganic insulating layer 201 and the second inorganic insulating layer 203. The connection conductive layer CL may be arranged between the second inorganic insulating layer 203 and the third inorganic insulating layer 205. The first voltage line VVL1 may be connected to the connection conductive layer CL through the first contact portion CNP1 of the second inorganic insulating layer 203.

Figure 10:
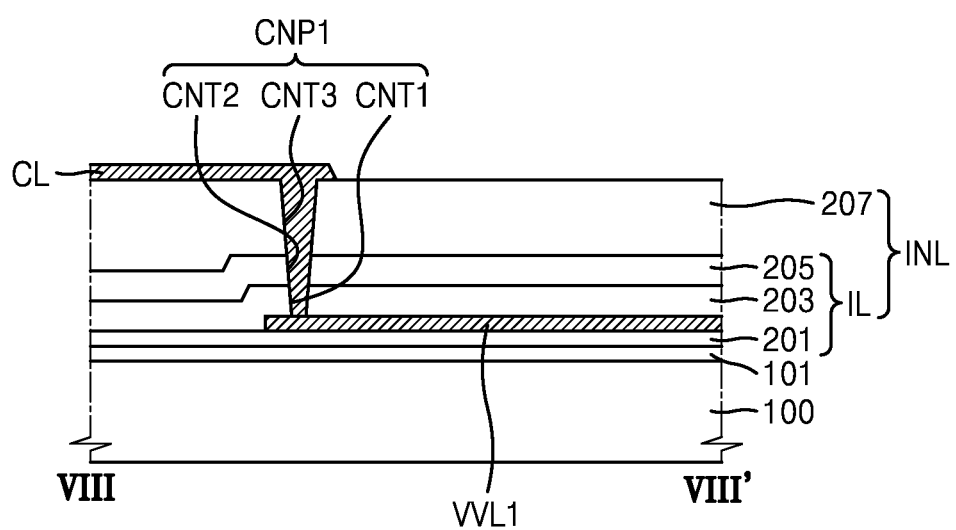
FIG. 10 is a cross-sectional view taken along line VIII-VIII' of FIG. 7 according to an embodiment.

FIG. 10 is a cross-sectional view of the display panel taken along line VIII-VIII' of FIG. 7 according to an embodiment.

Referring to FIG. 10, the display panel may include the buffer layer 101 and the insulating layers INL on the substrate 100. The insulating layers INL may include the inorganic insulating layer IL and the organic insulating layer 207. The inorganic insulating layer IL may include the first inorganic insulating layer 201, the second inorganic insulating layer 203, and the third inorganic insulating layer 205.

The first voltage line VVL1 may be arranged between the first inorganic insulating layer 201 and the second inorganic insulating layer 203. The connection conductive layer CL may be arranged on the organic insulating layer 207.

The first voltage line VVL1 may be connected to the connection conductive layer CL through the first contact portion CNP1. The first contact portion CNP1 may include the first contact hole CNT1, the second contact hole CNT2, and a third contact hole CNT3. The first contact hole CNT1 may be provided in the second inorganic insulating layer 203, and the second contact hole CNT2 may be provided in the third inorganic insulating layer 205. The third contact hole CNT3 may be provided in the organic insulating layer 207. The first contact hole CNT1, the second contact hole CNT2, and the third contact hole CNT3 may overlap one another and be connected to each other.

Figure 11:
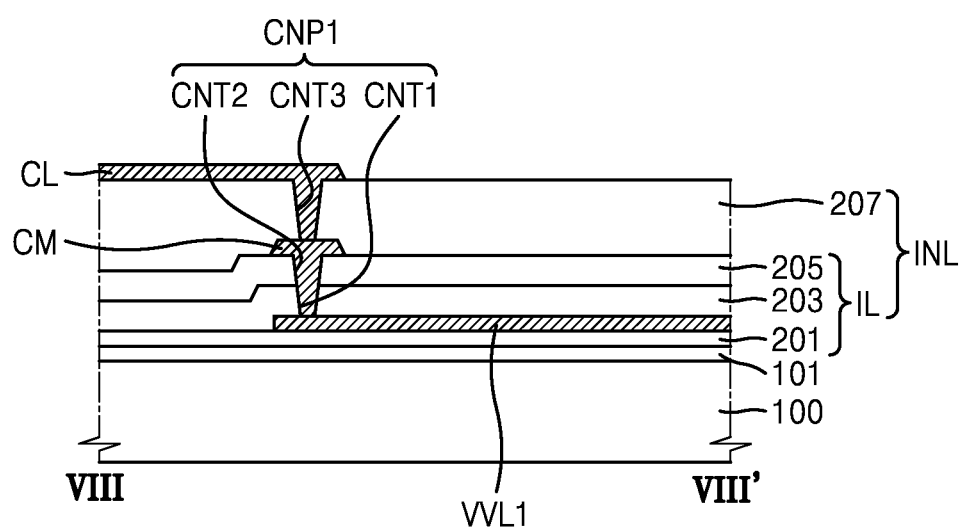
FIG. 11 is a cross-sectional view taken along line VIII-VIII' of FIG. 7 according to another embodiment.

FIG. 11 is a cross-sectional view of the display panel taken along line VIII-VIII' of FIG. 7 according to an embodiment.

Referring to FIG. 11, the display panel may include the buffer layer 101 and the insulating layers INL on the substrate 100. The insulating layers INL may include the inorganic insulating layer IL and the organic insulating layer 207. The inorganic insulating layer IL may include the first inorganic insulating layer 201, the second inorganic insulating layer 203, and the third inorganic insulating layer 205.

The first voltage line VVL1 may be arranged between the first inorganic insulating layer 201 and the second inorganic insulating layer 203. The connection conductive layer CL may be arranged on the organic insulating layer 207. A connection electrode CM may be arranged (at least partially) between the third inorganic insulating layer 205 and the organic insulating layer 207. The connection electrode CM may include the same material as the first voltage line VVL1 and the connection conductive layer CL.

The first voltage line VVL1 may be connected to the connection electrode CM through the first contact hole CNT1 and the second contact hole CNT2. The first contact hole CNT1 may be provided in the second inorganic insulating layer 203, and the second contact hole CNT2 may be provided in the third inorganic insulating layer 205. The first contact hole CNT1 may overlap and be connected to the second contact hole CNT2.

The connection conductive layer CL may be connected to the connection electrode CM through the third contact hole CNT3. The third contact hole CNT3 may be provided to the organic insulating layer 207. Therefore, the connection conductive layer CL may be connected to the first voltage line VVL1 through the connection electrode CM. The connection conductive layer CL may be connected to the first voltage line VVL1 through the first contact portion CNP1 of the insulating layers INL.

Figure 12:
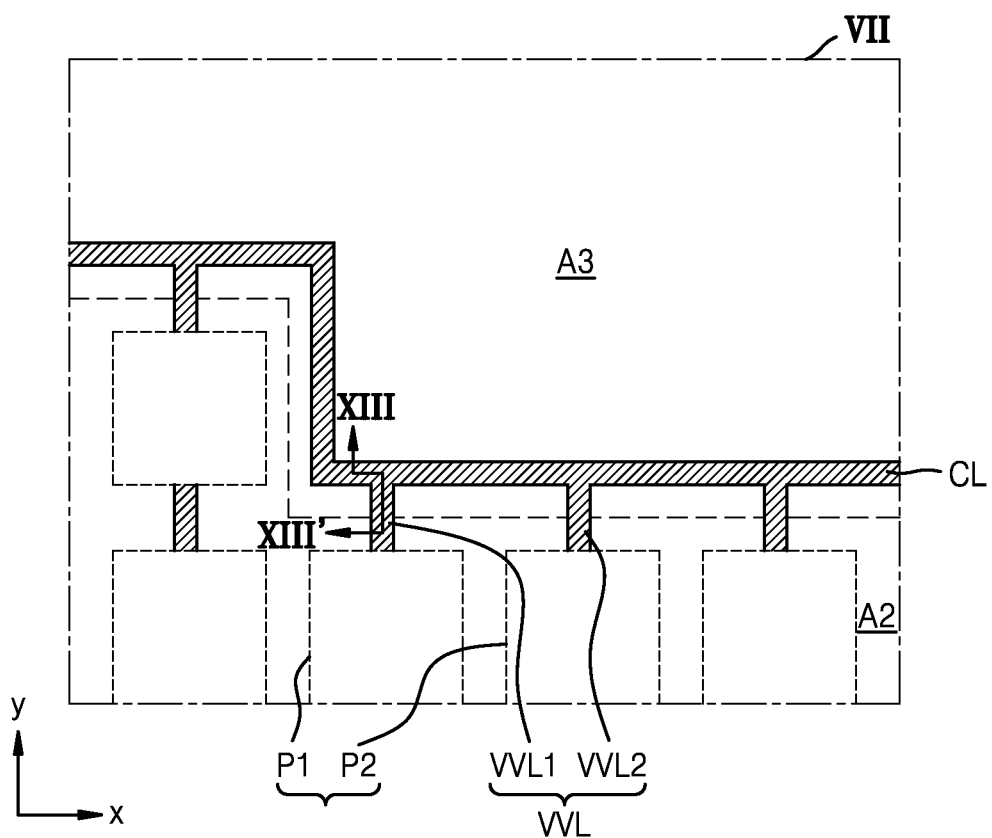
FIG. 12 is a plan view of region VII of FIG. 5 according to an embodiment.

FIG. 12 is a plan view of a region VII of FIG. 5 according to another embodiment.

Referring to FIG. 12, the substrate may include the second area A2 and the third area A3, the second area A2 surrounding the first area A1, and the third area A3 being arranged between the first area A1 and the second area A2.

A plurality of pixels P may be arranged in the second area A2, the pixels P each including a pixel circuit and a display element. The plurality of pixels P may be arranged in the first direction (e.g. the x direction) or the second direction (e.g. the y direction). Some of the pixels P may neighbor each other and neighbor the third area A3. For example, the first pixel P1 and the second pixel P2 may be aligned in the first direction (e.g. the x direction) and may neighbor the third area A3.

Some of the pixels P may be connected to a voltage line extending from the second area A2 to the third area A3, for example, the vertical voltage line VVL, which is a section of the initialization voltage line VL. The vertical voltage line VVL may extend in the second direction (e.g. the y direction) from the connection conductive layer CL. The first pixel P1 may be connected to the first voltage line VVL1 extending in the second direction (e.g. the y direction), and the second pixel P2 may be connected to the second voltage line VVL2 extending in the second direction (e.g. the y direction). The vertical voltage line VVL may include a conductive material including molybdenum (Mo), aluminum (Al), copper (Cu), and/or titanium (Ti) and may include a single layer or a multi-layer structure.

The connection conductive layer CL may be arranged in the third area A3. The connection conductive layer CL may neighbor the second area A2. The connection conductive layer CL may be bent along pixels P arranged in the second area A2. The conductive layer CL may include a conductive material including molybdenum (Mo), aluminum (Al), copper (Cu), and/or titanium (Ti) and may include a single layer or a multi-layer structure. The connection conductive layer CL and the vertical voltage line VVL may include the same material. For example, when the vertical voltage line VVL includes molybdenum (Mo), the connection conductive layer CL may also include molybdenum (Mo).

The connection conductive layer CL may be arranged directly on the same layer as the voltage line. The connection conductive layer CL may be provided as one body with the voltage line. For example, the connection conductive layer CL may be arranged directly on the same layer as the vertical voltage line VVL and provided as one body with the vertical voltage line VVL. The horizontal voltage line HVL described in FIG. 5 may be arranged directly on the same layer as the connection conductive layer CL and provided as one body with the connection conductive layer CL. The connection conductive layer CL may include the same material as the vertical voltage line VVL, and stain potentially caused by a brightness difference of light emitted from pixels P may be prevented.

Figure 13:
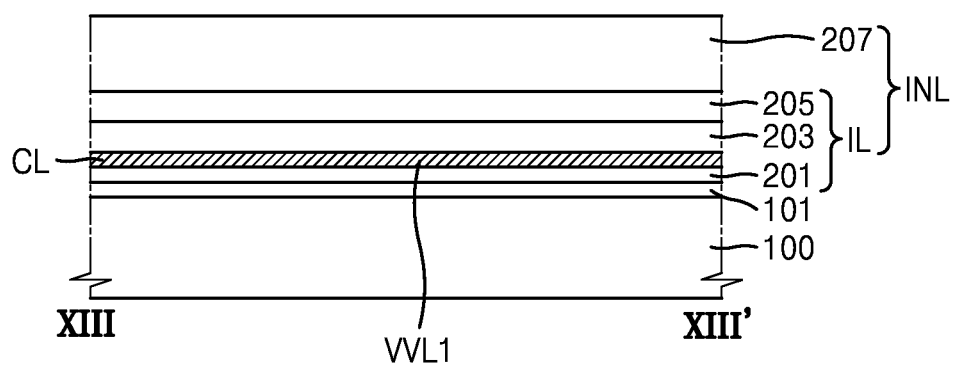
FIG. 13 is a cross-sectional view taken along line XIII-XIII' of FIG. 12 according to an embodiment.

FIG. 13 is a cross-sectional view of the display panel taken along line XIII-XIII' of FIG. 12 according to an embodiment.

Referring to FIG. 13, the display panel may include the buffer layer 101 and the insulating layers INL on the substrate 100. The insulating layers INL may include the inorganic insulating layer IL and the organic insulating layer 207. The inorganic insulating layer IL may include the first inorganic insulating layer 201, the second inorganic insulating layer 203, and the third inorganic insulating layer 205.

The first voltage line VVL1 and the connection conductive layer CL may be arranged directly on the same layer and provided as one body. The first voltage line VVL1 and the connection conductive layer CL may be arranged between the first inorganic insulating layer 201 and the second inorganic insulating layer 203.

Figure 14:
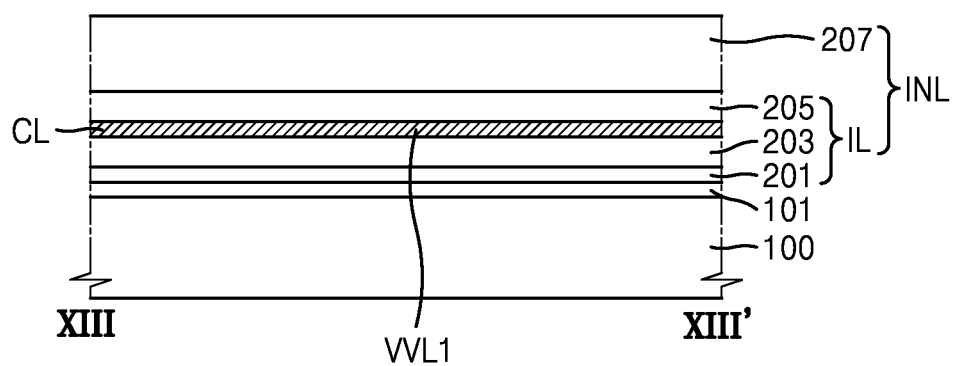
FIG. 14 is a cross-sectional view taken along line XIII-XIII' of FIG. 12 according to an embodiment.

FIG. 14 is a cross-sectional view of the display panel taken along line XIII-XIII' of FIG. 12 according to another embodiment.

Referring to FIG. 14, the display panel may include the buffer layer 101 and the insulating layers INL on the substrate 100. The insulating layers INL may include the inorganic insulating layer IL and the organic insulating layer 207. The inorganic insulating layer IL may include the first inorganic insulating layer 201, the second inorganic insulating layer 203, and the third inorganic insulating layer 205.

The first voltage line VVL1 and the connection conductive layer CL may be arranged directly on the same layer and provided as one body. The first voltage line VVL1 and the connection conductive layer CL may be arranged between the second inorganic insulating layer 203 and the third inorganic insulating layer 205.

Embodiments may include the connection conductive layer surrounding the transmission area in the first non-display area and connected to the voltage line. Since the voltage line and the connection conductive layer may include the same material, a resistance deviation between the first initialization voltage line and the second initialization voltage line may be minimized.

Therefore, stain potentially caused by a brightness difference of light emitted from pixels may be prevented.

Example embodiments described herein are illustrative and not for purposes of limitation. Descriptions of features or aspects within each embodiment may be available for other embodiments. Various changes in form and details may be made in the example embodiments without departing from the scope defined by the following claims.

What is claimed is:

1. A display apparatus comprising:
a substrate including a transmission area, a display area, and a first non-display area, the display area surrounding the transmission area, the first non-display area being positioned between the transmission area and the display area, no image-displaying pixels being positioned on the transmission area or the first non-display area;
a first pixel arranged on the display area and including a display element and a pixel circuit;
a voltage line set electrically connected to the pixel circuit and overlapping both the display area and the first non-display area; and
a connection conductive layer positioned on the first non-display area, surrounding the transmission area, and electrically connected to the voltage line set,
wherein a material of the voltage line is identical to a material of the connection conductive layer.

2. The display apparatus of claim 1, comprising an insulating material layer directly contacting the voltage line set and spaced from the connection conductive layer.

3. The display apparatus of claim 2, comprising an inorganic insulating layer arranged between the substrate and the display element,
wherein the voltage line set is electrically connected to the connection conductive layer through a contact hole of the inorganic insulating layer.

4. The display apparatus of claim 3, wherein the inorganic insulating layer includes a first inorganic insulating layer, a second inorganic insulating layer, and a third inorganic insulating layer,
wherein the first inorganic insulating layer is the insulating material layer, and
wherein the voltage line set is arranged between the first inorganic insulating layer and the second inorganic insulating layer.

5. The display apparatus of claim 4, wherein the connection conductive layer is arranged between the second inorganic insulating layer and the third inorganic insulating layer.

6. The display apparatus of claim 3, comprising an organic insulating layer arranged between the inorganic insulating layer and the display element,
wherein the connection conductive layer is arranged between the inorganic insulating layer and the organic insulating layer.

7. The display apparatus of claim 2, comprising an inorganic insulating layer and an organic insulating layer each arranged between the substrate and the display element,
wherein the connection conductive layer is arranged on the organic insulating layer, and
wherein the voltage line set is electrically connected to the connection conductive layer through a contact hole of the inorganic insulating layer and the organic insulating layer.

8. The display apparatus of claim 7, comprising a connection electrode at least partially arranged between the inorganic insulating layer and the organic insulating layer,
wherein the voltage line set is electrically connected to the connection conductive layer through the connection electrode.

9. The display apparatus of claim 1, comprising an insulating material directly contacting each of a face of the voltage line set and a face of the connection conductive layer, wherein the face of the voltage line set and the face of the connection conductive layer are directed connected to each other and are both formed of the material of the voltage line set.

10. The display apparatus of claim 1, comprising a second pixel neighboring the first pixel,
wherein the voltage line set includes a first voltage line and a second voltage line, and
wherein the connection conductive layer is electrically connected through the first voltage line to the first pixel and is electrically connected through the second voltage line to the second pixel.

11. The display apparatus of claim 1, wherein the voltage line set includes a first initialization voltage line that is positioned between two portions of the transmission area in a first direction or a second direction different from the first direction.

12. The display apparatus of claim 11, comprising a second initialization voltage line extending in the first direction and spaced from the transmission area in the second direction.

13. The display apparatus of claim 1, wherein the voltage line set includes:
a first horizontal voltage line being lengthwise in a first direction and directly connected to the connection conductive layer; and
a vertical voltage line directly connected to the connection conductive layer and being lengthwise in a second direction different from the first direction.

14. The display apparatus of claim 13, wherein the voltage line set includes a second horizontal voltage line that is a mirror image to the first horizontal voltage line with respect to the transmission area.

15. A display apparatus comprising:
a substrate including a transmission area, a display area, and a first non-display area, the display area surrounding the transmission area, the first non-display area being positioned between the transmission area and the display area, no image-displaying pixels being positioned on the transmission area or the first non-display area;
a first pixel and a second pixel neighboring each other, positioned on the display area, and each including a display element and a pixel circuit;
a first voltage line;
a second voltage line; and
a connection conductive layer arranged on the first non-display area, electrically connected through the first voltage line to the first pixel, and electrically connected through the second voltage line to the second pixel,
wherein a material of the first voltage line, a material of the second voltage line, and a material of the connection conductive layer are identical to each other.

16. The display apparatus of claim 15, comprising an insulating material layer directly contacting the first voltage line and spaced from the connection conductive layer.

17. The display apparatus of claim 16, comprising insulating layers arranged between the substrate and the display element of the first pixel,
wherein the first voltage line is connected to the connection conductive layer through a first contact hole of the insulating layers.

18. The display apparatus of claim 15, wherein the first voltage line, the second voltage line, and the connection conductive layer are provided as one body.

19. The display apparatus of claim 15, wherein the connection conductive layer surrounds the transmission area.

20. The display apparatus of claim 15, comprising a terminal electrically connected to each of the first voltage line and the second voltage line and configured to receive an initialization voltage.

* * * * *